US007811744B2

(12) United States Patent
Figov

(10) Patent No.: US 7,811,744 B2

(45) **Date of Patent: *Oct. 12, 2010**

(54) MATERIAL FOR INFRARED LASER ABLATED ENGRAVED FLEXOGRAPHIC PRINTING PLATES

(75) Inventor: Murray Figov, Ra'anana (IL)

(73) Assignee: Kodak IL. Ltd., Petach Tikva (IL)

( * ) Notice: Subject to any disclaimer, the term of this patent is extended or adjusted under 35 U.S.C. 154(b) by 113 days.

This patent is subject to a terminal disclaimer.

(21) Appl. No.: 11/629,886

(22) PCT Filed: Feb. 21, 2005

(86) PCT No.: PCT/IL2005/000212

§ 371 (c)(1), (2), (4) Date: Dec. 18, 2006

(87) PCT Pub. No.: WO2005/084959

PCT Pub. Date: Sep. 15, 2005

(65) Prior Publication Data

US 2008/0076061 A1 Mar. 27, 2008

Related U.S. Application Data

(60) Provisional application No. 60/549,151, filed on Mar. 3, 2004, provisional application No. 60/583,600, filed on Jun. 30, 2004.

(51) Int. Cl.

| | |
|---|---|
| ***G03F 7/00*** | (2006.01) |
| ***G03F 7/20*** | (2006.01) |
| ***G03F 7/26*** | (2006.01) |

(52) U.S. Cl. .................... 430/306; 430/269; 430/270.1; 430/273.1; 430/296; 430/330

(58) Field of Classification Search ............. 430/270.1, 430/302

See application file for complete search history.

(56) References Cited

U.S. PATENT DOCUMENTS

| | | | | |
|---|---|---|---|---|
| 5,804,353 | A * | 9/1998 | Cushner et al. | 430/306 |
| 5,858,617 | A * | 1/1999 | Nakayama et al. | 430/281.1 |
| 6,090,529 | A | 7/2000 | Gelbart | |
| 6,599,679 | B2 * | 7/2003 | Philipp et al. | 430/273.1 |
| 6,938,548 | B1 * | 9/2005 | Cormier et al. | 101/480 |
| 6,989,182 | B2 * | 1/2006 | Chen et al. | 428/36.8 |
| 2002/0069777 | A1 * | 6/2002 | Rossini et al. | 101/401.1 |
| 2004/0157162 | A1 * | 8/2004 | Yokota et al. | 430/306 |
| 2008/0258344 | A1 * | 10/2008 | Regan et al. | 264/400 |

FOREIGN PATENT DOCUMENTS

| | | |
|---|---|---|
| EP | 1 154 322 | 11/2001 |
| WO | WO 02/054154 | 7/2002 |

* cited by examiner

*Primary Examiner*—Amanda C Walke
*Assistant Examiner*—Chanceity N Robinson
(74) *Attorney, Agent, or Firm*—J. Lanny Tucker

(57) ABSTRACT

A non-photosensitive flexographic liquid or paste precursor comprising a mixture of acrylate oligomers and acrylic or methacrylate monomers, infrared absorbing material, fillers and heat decomposable peroxide, which when heated forms a non-thermoplastic elastomeric solid material in the form of a flexographic printing blank engravable by infrared laser ablation.

22 Claims, No Drawings

MATERIAL FOR INFRARED LASER ABLATED ENGRAVED FLEXOGRAPHIC PRINTING PLATES

CROSS-REFERENCE TO RELATED PATENT APPLICATIONS

This patent application claims priority from and is related to U.S. Provisional Patent Application Ser. No. 60/549,151, filed 3 Mar. 2004, and U.S. Provisional Patent Application Ser. No. 60/583,600, filed 30 Jun. 2004, these U.S. Provisional Patent Applications incorporated by reference in their entirety herein.

FIELD OF INVENTION

This invention relates to formulations and their application to produce flexographic printing plates and sleeves for engraving by ablation using infrared lasers.

BACKGROUND OF INVENTION

Flexography is a method of printing whereby a flexible plate with a relief image is situated around a cylinder and its relief image is inked up and the ink then transferred to a suitable substrate. The process has mainly been used in the packaging industry where the plates could be sufficiently soft and the contact sufficiently gentle to print on uneven substrates such as corrugated cardboard as well as flexible materials such as polypropylene film. The quality of the printing was far inferior to processes such as lithography and gravure, but nevertheless found markets that were applicable to the process. In order to accommodate the various types of substrates, flexographic plates have to have a rubbery or elastomeric nature whose precise properties must be adjusted for each particular substrate.

The methods of producing flexographic plates have shown progress over the years, although the various historical means of producing plates still find places in the present market. Initially, flexographic plates were made by cutting the relief image into a sheet of rubber with a knife. An improvement was achieved by forming a mold that could be produced by photo-etched graphics and then pouring rubber into the mold and vulcanizing to form the plate. This produced much finer and more accurate images, and it started to be worthwhile to compensate for image distortion when the plate was bent around the printing cylinder. A further improvement came about with the development of liquid photopolymers. Mixtures of such materials could be poured into a framework and exposed by UV light from the back to produce the floor of the plate and exposed by ultraviolet light from the front through a negative working photo tool to produce the relief image. The UV light hardened the material in the image areas and the un-imaged liquid photopolymer could be washed away with solvent. Such a process is instanced in U.S. Pat. No. 3,794,494 by Kal et als. and in U.S. Pat. No. 3,960,572 by Ibata et al. The liquid mixture of polymers was sold to the customer to prepare and expose the plates. These mixtures are referred to in this application as liquid photopolymers and the plates made by this process are referred to as liquid photopolymer plates albeit that after exposure and development they are completely solid.

U.S. Pat. No. 4,323,636 by Chen describes the use of thermoplastic elastomeric block copolymers. Instances of these block copolymers are those made by Shell Chemical Company and sold under the trademark of "Kraton". They are used in conjunction with an acrylate or methacrylate monomer and a photoinitiator. The layer can be formed by solvent deposit or extrusion and the plate material can be bonded to a base substrate. The upper surface may have on it a thin hard flexible solvent soluble coating and on top of this a strippable thin film of e.g. polyethylene to protect the plate during storage. This would then constitute a flexographic printing blank that can be sold to the customer as a solid plate, imaged by ultra-violet exposure through a negative mask, and the unpolymerized material washed away with solvent. The term "blank" is used in this application to describe unimaged plates. Such plates are usually of a thickness of one or more millimeters. In this application they will be referred to as solid plates as the blanks are solid. Solid plates are regarded as an improvement over the liquid photopolymer plates because they are easier to handle and prepare for imaging.

U.S. Pat. No. 4,994,344 by Kurtz et al. is entitled Sheetlike Light-Sensitive Recording and describes flexographic printing blanks made using ethylene-propylene-alkadiene terpolymers with a photopolymeric initiator, monomer and inhibitor of thermally initiated polymerization. It includes the process of initial back exposure to establish the floor of the plate before image exposure from the front of the plate through a negative mask.

U.S. Pat. No. 5,719,009 by Fan describes an invention that typifies the next significant development in flexographic plate processing. This invention eliminates the need for a negative phototool because it is integral in the flexo plate itself. The flexoplate comprises solid photosensitive layers as described in previously mentioned patents. The plates of this invention have an over-layer containing carbon black with a binder resin. The black layer is ablated with an infrared laser in response to a digital signal received in response to a pattern shown on a computer. Digital imaging using a modulated laser source is an important part of the general technology that has become known as computer-to-plate (CTP) and is used for instance in the production of offset lithographic printing plates. In the case of the Fan '009 invention, the energy used to ablate the integral photo-tool has to be significantly higher than that in imaging CTP litho plates and energies up to 3.6 joules per square centimeter are mentioned in the Fan '009 patent. The ablated areas in the carbon coating permit UV light to expose the sensitive elastomeric layer and harden it. The other unexposed areas situated under the unablated carbon layer are washed away together with the remains of the carbon layer, leaving a relief image.

Although the Fan invention shows significant improvement in image quality and ease of handling of the plate, as well as process simplification, it has long been recognized that the simplest way of making a flexographic printing plate would be by direct engraving with a laser beam, eliminating all need for washing or drying the plate or multiple types of exposure.

Caddell in U.S. Pat. No. 3,549,733 describes the formation of a laser engraved relief printing plate. The preferred radiation source is a $CO_2$ laser and preferred polymers were those that did not form ridges around the image areas. The plates described would not have the elastomeric properties needed for flexographic printing but could be used in letterpress printing. Letterpress printing differs significantly from flexographic printing in that it is more akin to lithography in the complexity of the printing machine and the type of ink used. Letterpress inks must be high viscosity paste-like, similar to offset inks and do not in general contain very volatile solvents. If the letterpress printing is via an offset blanket the printing process is termed dry offset. As with offset printing, dry offset and letterpress require high pressure between the plate and blanket or substrate to achieve good ink transfer, whereas flexographic printing uses the minimum pressure possible. Thus a letterpress plate would be unsuitable for flexo printing as it would not give good ink transfer under low pressure and similarly a flexographic plate would be unsuitable for letterpresses as the high pressure would distort the softer plate and give very poor image quality with huge dot gain.

U.S. Pat. No. 5,259,311 by McCaughey Jr. directly relates to laser engraving of flexographic polymeric printing plates. However, this process, whilst employing a carbon dioxide laser for imaging, needs several other UV flood exposure steps and washing out of imaged material.

Cushner et als. in U.S. Pat. Nos. 5,798,202 and 5,804,353 describe single or multiple layers of elastomers for direct laser engraving of flexographic plates with various methods or combination of methods of reinforcement of the layers, including where any chemical reinforcement of the layers is inter als not a peroxide. The patents use (although not the preferred IR absorbers) dyes etc. and may involve additional UV curing stages. Imaging sensitivity is limited by the use of large quantities of block polymers such as the Kratons. Poor melt edges are reported for flexographic engraving of mixtures containing such polymers by Hiller in US Published Application 2002/01369A1 in Comparative Examples.

Gelbart in U.S. Pat. Nos. 6,090,529 and 6,159,659 claims elastomeric foams with a sealing top layer of the same chemical nature as the foam material, for laser engraving to produce flexographic plates. Such material can be more easily ablated or collapsed during laser engraving as the density of the plate material is reduced by the foam cells. The foam may include microspheres with either glass or plastic walls.

Hiller at als. In U.S. Pat. No. 6,511,784 and in US 2002/0136969A1 claim laser engraving of flexographic printing plates comprising silicone rubbers and laser absorbing fillers such as iron oxide or carbon black US2003/0129530 by Leinenbach et als. claims a method for laser engravable flexographic printing elements on flexible metallic supports. The actual engravable layer contains an elastomeric binder, an absorber of radiation, an evaporatable solvent and a polymerization initiator.

US2003/0136285 by Telser et als. describes a method of preparing flexo plates for laser engraving in which the plate is first cross-linked on the surface by UV or heat. This patent, as with previous patents, employs mixtures dissolved in solvent and deposited from the solvent. The disadvantage of the use of solvent is that it has to be thoroughly removed during plate manufacture. If the mixture is deposited by coating methods, it has to be done in several passes because the thickness of the plate demands this approach. Otherwise, the solvent escapes from the coating as bubbles as it dries on the surface before the solvent escapes from the bulk of the material. If molding is attempted, the mold shows shrinkage during solidification.

US2003/0180636 by Kanga et al describes laser engraving flexo plates where a UV sensitive material is mixed with hydrocarbon-filled plastic microspheres and an infra red (IR) dye. The composition is heated to expand the microspheres and extruded to form a plate. The plate is then engraved with an infrared laser. The energy causes the foam to collapse and then the plate is UV cured to harden it off. This patent addresses the problem also expressed in the Gelbart patents ('529 and '659) that laser engraving is long and tedious—especially with low-powered laser diodes—and that carbon dioxide lasers lack beam resolution and cause anomalies due to heat dissipation.

Despite the limitations of $CO_2$ lasers they are now being used commercially in flexo engraving machines. They have a reputation for slow and expensive imaging of limited resolution related to the 10.6 micron wavelength of the imaging radiation produced by the $CO_2$ laser. The attractions of direct engraving are sufficient to ensure commercial use where fast imaging and high print quality are not required. However, it would be preferable to use infrared diodes which produce radiation in the near infrared—approximately 800 to 1100 nm—and have the advantages of high resolution and relatively low laser cost so that they can be used in large arrays. Up until now, although the use of such lasers is claimed in many engraving patents, they have not been of industrial application because even combined with the most sensitive plates available, satisfactory engraving could not be achieved.

With the recent availability of IR laser diodes that can produce power of 8 watts or greater—herein referred to as high power lasers diodes—the inventor has now found it possible to formulate flexographic printing plates which can be rapidly engraved using such lasers. Moreover, such plates have distinct advantages over the prior art in ease of production, ease of use and resolution of image.

SUMMARY OF THE INVENTION

The present invention provides a flexographic printing blank comprising a mixture of carbon black or other IR absorbing materials, acrylic pre-polymers and peroxide free radical generator in a solventless low viscosity non-elastomeric liquid, which on heating solidifies to give an elastomeric mixture that can be engraved by powerful laser diodes emitting in the near infrared.

It is a further object of the invention that the plate material be non photo-sensitive and so easily handled in daylight. The term "photosensitive" is used here in the sense of being sensitive to visible and UV light but excludes IR radiation as used to engrave the plates.

It is a further object of the invention to provide a heat polymerizable solventless mixture that is based on mixtures of acrylates and methacrylates of sufficiently low viscosity to facilitate molding of the plate with subsequent heat cross-linking.

It is a further object of the invention to provide infra red engravable flexographic printing blanks in the thickness range of one to two millimeters for the production of the top of the range printing quality.

It is a further object of the invention to provide a self-assembling layer in which smooth surface layers appear over foam-like structures during cross-linking of a single layer deposition.

It is a further object of the invention to provide mixtures for cross-linking to form flexo blanks, where such mixtures have long pot lives due to the predominantly anaerobic curing on heating in an oxygen free environment

DETAILED DESCRIPTION OF THE INVENTION

This invention describes the formulation and fabrication of solid flexographic printing plate blanks and sleeve blanks that can be rapidly imaged by ablation engraving, utilizing a relatively high powered infra red laser diode to be used to produce high quality high resolution printed output.

The plate is formulated from a mixture of acrylate oligomers and acrylate and/or methacrylate monomers together with carbon black or other infra red absorbing materials or mixtures of such materials, a filler material, and peroxide which decomposes on heating to produce free radicals that will cure the mixture by causing cross-linking, to give a solid flexo printing blank. Other optional ingredients may be used, including plasticizers and anti-ozone additives. It has been found that high-powered infra-red laser diodes (8 watts and more) can give high resolution and the acrylate formulations used give images with very sharp edges. Such acrylate monomers and oligomers are often used with photoinitiators as a part of formulations used in flexographic printing plates, but, in the case of this invention, photoinitiators should not be included as they impart unwanted light sensitivity. The insensitivity of the material mixtures to both ultra-violet and visible light is advantageous, as in all stages of the process—both manufacturing and customer use—no special precautions for handling in direct sunlight, or even in daylight need be taken.

The infrared absorbing component of the material must be a material that is unaffected even at high temperatures of 120° C. to 200° C. by free radical generators such as peroxides. The preferred IR absorber is carbon black, but other pigments such as iron oxide can be used. The latter pigment has an advantage that when copious material is ablated, a magnet can be used to collect much of the ablated detritus. More than one such pigment can be used in a formulation. Most infrared dyes cannot be used in the system because they react with the peroxide during preparation of the flexo printing blank when the mixtures are heated as defined above. So for instance, ADS830A (American Dye Source Inc.)—a benz[e]indolium—loses its near infra-red absorption peak when it is incorporated in the flexo plates of this invention during the curing process and cannot be used as an infra-red absorber. However, it has been found, surprisingly, that after heat curing plates containing nigrosine, the nigrosine still shows absorption in the infra-red and can be used as the infra-red absorber of this invention. The amount of carbon or other IR absorber used in the formulation is between 4% and 20% by weight of the total formulation. The preferred amount of infra-red absorber is between 4% and 9% by weight. Less than 4% by weight does not give sufficient contribution to absorption of the infrared radiation to obtain sufficient relief from ablation. More than 20% by weight makes it difficult to formulate to achieve the elastomeric properties needed for a flexographic plate and tends, during imaging, to give tarry deposits on the imaging head and re-deposition of ablated material onto the plate. Quantities of carbon black even as low as 4% by weight make it impossible to use a UV or visible light sensitive system as a means of cross-linking the plate by the inclusion of photo-initiator as the basis of the flexo plate, as the carbon inhibits all curing by these forms of radiation.

The mixture contains as a heat-curing agent a peroxide. Examples of suitable peroxides are benzoyl peroxide and cumene hydroperoxide. The amount used in the formulation must be sufficient to give complete curing. This has been found to be between 1% and 12% by weight of the total formulation. The preferred amount is between 1% and 5%. Cumene hydroperoxide is preferred as it gives mixtures of pot lives of over 3 hours and in many cases over 24 hours, which permits any process such as air removal or molding to be completed before polymerization. It is considered that the reason for this is that cross-linking is inhibited by the presence of oxygen and only when the oxygen is radically reduced by either using a closed mold or a non-oxygen containing atmosphere will good complete cross-linking be achieved. Benzoyl peroxide is preferably used together with a thermal inhibitor such as phenothiazine as otherwise the pot life may be as low as 15 minutes.

In order to facilitate the ablation to a commercially acceptable relief depth, a preferred approach is to reduce the flexo blank density as taught by Gelbart in U.S. Pat. No. 6,159,659, by the introduction of a foam or similar structure. This patent (the '659) is incorporated herein for reference. Gelbart uses means of density reduction such as glass or plastic microspheres. Other inert materials may also be used if they contribute to better imaging and sharper images. Such inert materials must be solids that remain in a solid form during use, reside in the formed plate blank as solids and do not react, thus retaining their chemical formula throughout incorporation. An example of inert solid would be fumed silica. Also, it has been found that sodium pyrophosphate is a suitable material. Although it is not in itself a density reducing material, it can be used to achieve lower density if incorporated into the formulation. It can be seen to have minimal interaction with its host system in that when placed in warm water, the pyrophosphate is leached out of the plate and can be seen as a white colloidal cloud. Examples of materials suitable as density reducers are plastic microspheres. The amount of density reducing or inert additive material found to be suitable in the formulation was found to be between 5% and 40% by weight of the total formulation. Less than this gives little sensitivity advantage and the decomposition products are gummy. More than this makes it too difficult to achieve elastomeric properties by formulation. This is in contrast to Gelbart—U.S. Pat. No. 6,159,659—who uses up to 90% of microspheres in the formulation.

Different types of solid additives act within the system in different ways. The hollow or solvent filled plastic microspheres give optimum density reduction as during the cross-linking process the microspheres burst and give the foam-like structure to the unimaged flexo blank. Blowing agents with a sufficiently low decompositon temperature have a similar effect. Examples are p-toluene sulfonyl hydrazide and 4,4'-oxybis (benzensulfonyl hydrazide). An unexpected result of the combination of using low viscosity acrylic mixtures together with the microspheres is that during polymerization there is a continuous film which self assembles on the surfaces of the plate. An indication that this would happen is that after thoroughly mixing the composition and leaving it in a vessel, the dull surface of the mixture becomes shiny. This appears to indicate the coverage of the surface by a less pigmented liquid film that remains after curing. It is not understood why this should happen as it would be more logical that the low-density microspheres would rise to the surface. However it does have benefits in that it provides a more continuous surface for printing than the foam-like structure within the plate and that if the plate requires a capping layer it could be easily coated onto this surface without problems of absorption into the sponge. Previous patents such as those of Gelbart are silent as to how to achieve an even coating on top of a foam-like coating, where during spreading the top coat would tend to follow the uneven contours of a foam-like surface or even be absorbed into the pores.

Inert solids, which reside within the system, behave in a manner different from that of the hollow or solvent filled plastic microspheres. For example, filled and unfilled plastic microspheres are not affected by heating during the cross-linking process. It is considered that they even remain intact during ablation, but are released from the coating by the disappearance of the surrounding ablated acrylic structure. As they themselves do not require ablation, they reduce the energy needed for imaging. They also reduce tar formation by a sort of diluting effect. Sodium pyrophosphate (when it is not extracted as described previously) probably behaves in a similar manner to the plastic microspheres. A preferred class of materials that are not decomposed by ablation but help produce very sharp images are the fumed silicas of which Cab-O-Sil M5 (by Cabot) is an example.

The principal elastomeric properties essential for this invention are the elongation measured at break point and the tensile strength at break point. Elongation at break as measured in accordance with ASTM D412 should be a minimum of 100% and tensile strength at break point as measured according to the same ASTM should not be less than 10 kgf per $cm^2$. A further property of the blank should be its resistance to tearing. Flexographic blanks of this invention should be resistant to tearing as defined below. This can be simply tested by hand. To clarify this test more fully, the hand test is made on sheets of polymerized material 2 mm thick. The straight edge of the sample is held parallel to the body by first fingers and thumbs of both hands situated a few millimeters apart. One hand is moved towards the body and the other away from the body in a tearing motion. However hard the hands are moved, the material should not tear. Achieving good tear resistance appears to be more of a formulation problem when the material is cured by thermal means than by UV curing. The tear resistance properties are imparted by the acrylate formulation as described below.

This particular invention is most suited to the use of relatively thin flexographic plates which lie between 1 millimeter and two millimeters. Such plates are particularly of use in printing relatively high quality work on smooth substrates where relief needed is less than a millimeter, relief being the distance in height between the upper print surface and the background surface. The minimum relief useable is 300 microns. Generally the achievable useful relief range is 300 to 600 microns. In the case of laser engraving, it is most efficient from the point of view of speed and ease of formulation to have plates of minimum relief because the greater the relief, the higher the energy needed to ablate the material, and the greater the sensitivity needed for fast imaging. Thus the invention is more applicable to use of printing on hard substrates (such as labels and plastic films) rather than on corrugated cardboard where the surface is very uneven and deep relief is needed to avoid printing background. This also means that the preferred plates of this invention will be relatively hard, having Durometer Shore A hardness of 60 to 90. This is because on smooth surfaces, the plates can be “kiss printed” with a minimum of dot gain. Where the printing substrate surface is rough—as is the case for instance of board used in packaging, plates will have Durometer Shore A hardnesses lower than 60 and will require relief higher than the above stated range.

The acrylate mixtures found most suitable comprise one or more acrylate oligomer and acrylate and/or methacrylate reactive monomer or monomers. The acrylate oligomer mixture should comprise at least one urethane acrylate oligomer, optionally with one or more other acrylate oligomer, which need not be a urethane acrylate. Any non-urethane acrylate oligomer should be not more than 10% by weight of the total oligomer content. The amount of oligomer acrylate should be between 15% and 40% by weight of the total formulation and the monomer or monomer mixture between 25% and 60% by weight of the total formulation. At least 80% by weight of the urethane oligomer content should be diacrylate. At least 80% by weight of the monomer mixture must be either mono-acrylates or mono-methacrylates and not di-, tri-, tetra- or penta or more acrylate groups per molecule. The higher acrylates have been found to reduce the elastomeric nature of the pre-polymer mixtures to too great an extent for use as dominant monomers in the invention. The mixtures of acrylates, on heat curing must be tear resistant as previously defined. Although commercially available urethane oligomer acrylates are proprietary and are consequently supplied with only limited information, manufacturers usually quote the number of acrylate groups per molecule and frequently describe whether the resultant cured film will be flexible. Tearable properties are not often quoted and the inventor has found that there are flexible oligomer urethane acrylates that can be torn and others that cannot. For instance, CN965 (Cray Valley) is not tearable and Ebecryl 230 (USB) is tearable. It could be concluded that according to this invention tearable urethane oligomers would be unsuitable, but in fact this is not the case as it has been found that they can be made untearable. Similarly untearable urethane oligomers can only be used with suitable reactive monomers, which sustain the non-tearable properties of the oligomer. So both of the above mentioned urethane oligomers are useful in this invention when used together with reactive monomers that either impart tear resistance or sustain it. It has been found that instances of reactive monomers that are suitable are isobornyl acrylate and isobornyl methacrylate. Instances of reactive monomers that sustain tearing properties or impart tearing properties are lauryl acrylate, phenoxyethyl acrylate, ethoxyethyl ethyl acrylate and hydroxyethyl methacrylate. This latter group are unsuitable as the total monomer content of the acrylic content of the flexo blank, and need the presence of reactive monomers that impart tear resistance to the extent of at least 25% by weight of total monomer content. Non-reactive diluents are also unsuitable as sole constituents of the non-oligomeric liquid content as they too impart tearing properties even to non-tearable urethane oligomers. An example of a non-reactive diluent is methyl pyrollidone. Metallic diacrylates may be used to improve tear strength, but as they are solid powders and increase viscosity of the mix, they can only be used in small quantities—less than 5% by weight of the total acrylate mix—and only in the presence of the reactive monomers that promote tear strength such as those instanced above.

Although the overall type of composition has a superficial similarity to those used in liquid photopolymer mixtures used to make flexo plates by the liquid photopolymer method, the actual mixtures used in this invention are very different in viscosity. The photopolymer mixtures as described in U.S. Pat. No. 6,403,269 have a most preferable viscosity range of 25,000 cps to 40,000 cps. As reported in the ’269 patent, when the viscosity is below the given range, the resin composition flows so rapidly that it can be hard to contain and handle. During the imaging process, internal flow would damage imaging quality. Viscosity of mixtures used in this invention without the presence of the IR sensitive material and the filler material should be below 2000 cps and preferably below 600 cps. This is necessary to permit the incorporation of the infrared absorber such as carbon black and the filler material. These materials may considerably increase viscosity and if the acrylic mixture has a high viscosity, the total mixture including IR absorber and filler material becomes a thick paste or solid which is difficult to mix and use for plate manufacture as will be further explained.

In addition, it is possible to add a small quantity of a non-acrylate polymer such as silicone or to add a plasticizer. The amount should be below 20% by weight of the total mixture and should not result in the total mixture becoming solid at room temperature. Such plasticizers are preferably long chain liquids with some reactive sites (such as double bonds) for chemically fixing the material into the system. Examples of a materials found to be suitable are oleyl alcohol, liquid polyisoprene and liquid polybutadiene.

It is possible to have a total of 5% by weight solvents within the mixture. Generally, solvents should be avoided as they cause bubbles to form during thermal curing and also result in significant shrinking if the material is thermally cured in a mold. With quantities of less than 5% by weight, the solvent may be totally removed during the deaerating under vacuum, thus avoiding the problems usually associated with solvent.

If the density reducing material is composed of microspheres, then precautions should be taken to avoid breaking the spheres during any mixing and pigment dispersion prior to polymerization. For instance, it is necessary to ensure good dispersion of the carbon black or other pigment. Such mixing requires high shear often exerted by means of a milling procedure. It is not possible to do such milling with the glass microspheres without breaking them and if such milling is required for the carbon black the glass microspheres should be subsequently stirred in. It is possible to disperse the carbon black in the lowest viscosity part of the mixture—i.e. the monomer—using a ball mill and then to add the other ingredients by stirring in. Because of the need to take care not to damage microspheres, the stirring methods for the microsphere incorporation mostly are not able to avoid the inclusion of air. Moreover, powder ingredients or solid materials in general bring air into the mixtures when they are added and the best way for taking out the air is to put the mixture under vacuum. This is easier with mixtures of lower viscosity and conversely harder with mixtures of higher viscosity. The higher the viscosity, the longer air removal will take and as explained below, once the free radical generator (i.e. peroxide) is added there is a danger of the mixtures thickening with time even at room temperature. Although the incorporation of air to produce a foam is desirable, the non-uniform occlusion just described results in the formation of large uneven pockets of air during the heat up of the mixture to cure. This causes large bubbles that can be several millimeters or even centimeters in length to form just under the surface of the blank, making the plate unusable.

This then is one of the reasons why it has been found necessary that the acrylate mixture should have a low viscosity. It enables the mixture prior to cross-linking to be molded with minimum problems from air occlusion, because the lower the viscosity the easier it is for air bubbles to rise to the surface and escape. It also enables the quantities of pigment and density reducing material enumerated above to be incorporated in the mixture without the formation of un-moldable solids.

An additional solution to the problem of uneven air occlusion has been found by using fumed silicas. These still need to be incorporated into low viscosity acrylate mixtures as they give high viscosity materials. However, any air trapped within the system does not form large air bubbles on curing the mixtures, but the air remains in an even dispersion throughout. It was found that it was not necessary to use vacuum to remove the air whose presence of course helps lower the density.

The total mixture including peroxide must be stable at room temperature over a period of at least three hours at ambient temperature, to permit the mixtures to be de-aerated and then formed into the plate or sleeve before heating to cross-link. Optionally, a second capping coat can be made on the surface of the main coating. This should have all the printing characteristics necessary, as it is the surface on which printing is done. These include good ink acceptance and wear resistance as well as suitable elastomeric properties. It may be of similar or different chemical composition to the main coat and may be UV or heat cured and deposited either from solvent or as a 100% cast film. It may or may not contain an IR absorber. It should be no more than 20 microns thick. Thicker films tend to adversely affect imaging sensitivity and if the film is less than 5 microns thick it will not function as a beneficial capping layer in the printing process. The layers can be formed with the thin capping layer being laid down and cured either before or after the other thicker layer.

The materials described may be used to produce flexographic printing plates or printing sleeves and although the preferred method of producing the finished flexographic printing blank is by mold, the material may be prepared by other methods such as extrusion.

It is possible to pre-mix the material and extrude it onto a cylinder, image by laser ablation and then print all from the same cylinder. Whilst such an on-press system is well known for offset lithographic printing, it has not been possible for flexo. After printing, the flexo plate material may be removed by either wet or dry scraping and the cylinder re-coated and re-used as described above. This may be construed as plateless flexo.

The following examples are given by way of illustration of the invention. All quantities are parts by weight.

EXAMPLE I

The following mixture termed Mixture A was ball-milled overnight;

| | |
|---|---|
| Mogul L Carbon Black | 81.6 g |
| Isobornyl monoacrylate | 386 g |

It was then mixed by paddle stirrer in the following composition:

| | |
|---|---|
| Ebecryl 230 | 51.5 g |
| Mixture A | 80.0 g |
| Hollow glass microspheres | 35.7 g |
| RTV silicone E | 18 g |
| RTV Silicone E curing agent | 1.8 g |
| Cumerene hydroperoxide | 3.8 g |

The mixture was stirred to give a homogeneous liquid and then poured into a metal mold, forming a layer 1.5 mm thick. It was deaerated by placing under a vacuum hood until all of the air had been expelled. A metal lid was the screwed on. The mold lid had a hole from which excess material could flow. This hole was then blocked and the mold was placed in an oven at 160° C. for one hour. The mold was then cooled and opened. The resulting plate material had a Shore A hardness of 70, a tensile strength of 52 kilograms force per $cm^2$ and an elongation of 400%. The solid plate was bonded to a 175 micron polyester for thermal laser engraving and then flexo printing.

EXAMPLE II

Mixture A of Example I was used in the following formulation;

| | |
|---|---|
| Ebecryl 230 | 10.83 g |
| Ebecryl 270 | 0.55 g |
| Mixture A | 17.68 g |
| Dualite E135 (plastic microspheres) | 2.00 g |
| Glass Microspheres | 6.68 g |
| Cumene hydroperoxide | 1.37 g |

The mixture was stirred to form a homogeneous liquid and placed in the container of a pressurized gun. The container was placed in a vacuum oven to remove all air and then used in the pressure gun to fill a mold. The filled mold was placed in an oven at 160° C. for 45 minutes and then the mold was opened and the plate formed was removed from the mold. This plate could be engraved using an infrared laser diode array and the engraved plate used for printing on a flexo printing machine.

If the isobornyl acrylate is mixed together with the two Ebecryls of the formulation and cumene hydroperoxide, the resulting liquid has a viscosity of around 470 cp, measured on a cone and plate Brookfield viscometer. The liquid appears to be Newtonian. Addition of the carbon black and the other ingredients of the formulation gives a thixotropic fluid that still has sufficient flow to permit the air to be easily removed under vacuum and the resulting mixture to be injected or filled by other means into a mold.

The density of the cured mixture of the liquids of the formulation (acrylates plus peroxide) is approximately 1.03. With the added solids (carbon black, hollow glass microspheres, plastic microspheres) the density reduces to 0.72.

The cured mixture had a Shore A hardness of 60, a tensile strength of 14 kilograms force per square centimeter and an elongation at break of 220%.

EXAMPLE III

Mixture B was made up as follows;

| | |
|---|---|
| Alcohol soluble nigrosine | 8.25 g |
| Isobornyl acrylate | 36.2 g |

The above ingredients were mixed in a ball mill 20 hours. This ensured that the nigrosine was fully dissolved. The following mixture was made up;

| | |
|---|---|
| Ebecryl 230 | 19.75 g |
| Ebecryl 270 | 1.02 g |
| Mixture B | 32.50 g |
| Glass Microspheres | 15.60 g |
| Liquid polyisoprene | 1.55 g |
| Cumene hydroperoxide | 2.56 g |

The polyisoprene used was a liquid with an average molecular weight around 40,000.

The mixture was stirred to give a homogeneous liquid and then poured into a metal mold, forming a layer 1.5 mm thick. It was deaerated by placing under a vacuum hood until all of the air had been expelled. A metal lid was then screwed on. The mold lid had a hole from which excess material could flow. This hole was then blocked and the mold was placed in an oven at 160° C. for one hour. The mold was then cooled and opened. The resulting plate material had a Shore A hardness of 52, a tensile strength of 21.9 kilograms force per $cm^2$ and an elongation of 288%. The solid plate was bonded to a 175 micron polyester for thermal laser engraving and then flexo printing.

EXAMPLE IV

Mixture C was made up as follows;

| | |
|---|---|
| SR423A | 14.01 g |
| SR 339 | 22.44 g |
| SR708F | 1.82 g |
| Mogul L | 5.04 g |

This was ball milled for 18 hours and used in the following formulation;

| | |
|---|---|
| Ebecryl 230 | 7.11 g |
| Ebecryl 270 | 0.26 g |
| Liquid polyisoprene | 0.62 g |
| Oleyly alcohol | 0.62 g |
| Mixture C | 15.50 g |
| Glass microspheres | 6.00 g |
| Cumene hydroperoxide | 0.62 g |

The mixture was stirred to give a homogeneous liquid and then poured into a metal mold, forming a layer 1.5 mm thick. It was deaerated by placing under a vacuum hood until all of the air had been expelled. A metal lid was then screwed on. The mold lid had a hole from which excess material could flow. This hole was then blocked and the mold was placed in an oven at 160° C. for one hour. The mold was then cooled and opened. The resulting plate material had a Shore A hardness of 65, a tensile strength of 34.7 kilograms force per $cm^2$ and an elongation of 372%. The solid plate was bonded to a 175 micron polyester for thermal laser engraving and then flexo printing.

EXAMPLE V

Mixture A of Example I was used in the following formulation;

| | |
|---|---|
| Ebecryl 112 | 4.72 g |
| Ebecryl 230 | 19.76 g |
| Mixture A | 38.90 g |
| Isobornyl acrylate | 17.01 g |
| Cumene hydroperoxide | 1.98 g |
| Cab-O-Sil M5 | 4.94 g |
| Poly(acrylonitrile-co-methyl acrylonitrile) | 12.70 g |

The mixture was stirred to give a homogeneous paste and then poured into a metal mold, forming a layer 1.5 mm thick. Because of the pasty nature of the material, no deaeration was carried out, nor needed. A metal lid was then screwed on. The mold lid had a hole from which excess material could flow. This hole was then blocked and the mold was placed in an oven at 160° C. for one hour. The mold was then cooled and opened. The resulting plate material had a Shore A hardness of 60, a tensile strength of 16.4 kilograms force per $cm^2$ and an elongation of 245%. The plate density was 0.562. The solid plate was bonded to a 175 micron polyester for thermal laser engraving and then flexo printing.

EXAMPLE VI

Mixture A of Example I was used in the following formulation;

| | |
|---|---|
| Ebecryl 112 | 4.13 g |
| Ebecryl 230 | 20.65 g |
| Mixture A | 40.69 g |
| Isobornyl acrylate | 0.61 g |
| Cumene hydroperoxide | 2.06 g |
| Poly(styrene-co-divinylbenzene) | 24.78 g |

The mixture was stirred to give a homogeneous paste and then poured into a metal mold, forming a layer 1.5 mm thick.

It was deaerated by placing under a vacuum hood until all of the air had been expelled. A metal lid was then screwed on. The mold lid had a hole from which excess material could flow. This hole was then blocked and the mold was placed in an oven at 160° C. for one hour. The mold was then cooled and opened. The resulting plate material had a Shore A hardness of 85, a tensile strength of 40 kilograms force per $cm^2$ and an elongation of 450%. The solid plate was bonded to a 175 micron polyester for thermal laser engraving and then flexo printing.

EXAMPLE VII

Mixture A of Example I was used in the following formulation;

| | |
|---|---|
| Ebecryl 1259 | 4.33 g |
| Ebecryl 230 | 28.81 g |
| Mixture A | 44.60 g |
| Cumene hydroperoxide | 3.36 g |
| Cab-O-Sil M5 | 15.80 g |
| Liquid polyisoprene | 3.20 g |

The mixture was first made up without the Cab-O-Sil, was thoroughly mixed and then the Cab-O-Sil added and stirred to give a thick homogeneous paste which was pasted into a metal mold, forming a layer 1.5 mm thick. A metal lid was then screwed on. The mold lid had a hole from which excess material could flow. The hole was then blocked and the mold was placed in an oven at 160° C. for one hour. The mold was then cooled and opened. The resulting plate material had a Shore A hardness of 65, a tensile strength of 26.1 kilograms force per $cm^2$ and an elongation of 163%. The solid plate was bonded to a 175 micron polyester for thermal laser engraving and then flexo printing.

EXAMPLE VIII

This example combined the formulations of Examples V and VII to form a two-layer composition. The formulation of Examples V was made up as described above. It was poured into a mold and a 50 micron metal shim that fitted into the mold was placed on top of the mixture before screwing on the metal lid. The mixture was placed in an oven at 160° C. for 40 minutes. The mold was then cooled and the lid and the shim removed. The material made as in Example VII was pasted on top of the previous mixture to fill up the mold and the lid replaced. The mixture was placed in an oven at 160° C. for one hour. The solid plate was bonded to a 175 micron polyester for thermal laser engraving and then flexo printing.

Sources of Raw Materials

Ebecryl 270, 230 urethane acrylate oligomers and Ebecryl 112—aliphatic monoacrylate monomer from UCB Drogenbos, Belgium . . . .

Mogul L. carbon black from Cabot Europa, Suresnes-Cedex, France . . . .

Silastic RTV Silicone E and curing agent from Dow Corning Michigan USA.

SR339C, SR708F (monomer acrylates) and SR423A (isobornyl methacrylate) from Cray Valley, Puteaux, France.

Dualite E135-plastic microspheres. Sovereign Specialty Chemicals, Buffalo, N.Y., USA.

The invention claimed is:

1. A flexographic infrared direct engraveable printing blank consisting essentially of two layers, wherein the first layer is formed by heating and curing a non-photosensitive flexographic liquid or paste precursor, and the second layer forms a capping layer designed for optimum printing qualities, the printing blank having a thickness of from 1 to 2 mm, the second layer being thinner than the first layer, wherein the non-photosensitive flexographic liquid or paste precursor comprises:

a mixture of acrylate oligomers and acrylate or methacrylate monomers;

infrared absorbing material;

a filler comprising a material that reduces the overall density of the resultant flexographic blank after heat curing, the filler being present in an amount of from 5 to 40 weight % and comprising hollow plastic microspheres, filled plastic microspheres, or poly(acrylonitrile-co-methyl acrylonitrile) microspheres; and a heat decomposable peroxide, wherein the viscosity of the mixture of acrylate oligomers and acrylate or methacrylate monomers is less than 2000 cps, which, when the flexographic liquid or paste precursor is heated, it forms a non-thermoplastic elastomeric solid material in the form of a continuous self assembled film that is directly engraveable by infrared laser ablation.

2. A flexographic infrared engraveable printing blank of claim 1, wherein the second layer is formed, followed by the formation of the first layer.

3. The flexographic infrared engraveable printing blank of claim 1, wherein the capping layer has been formed by heating, or has been cured by UV light.

4. The flexographic infrared engraveable printing blank of claim 1, wherein the capping layer is from 5 to 20 microns thick.

5. The flexographic infrared engraveable printing blank of claim 1, wherein the capping layer is deposited from solvent, or as a 100% cast film.

6. The flexographic infrared engraveable printing blank of claim 1, wherein the capping layer comprises an IR absorber.

7. The flexographic infrared engraveable printing blank of claim 1, wherein on cross-linking the first layer has a foam-like internal structure with a self-assembled non-foam surface.

8. The flexographic infrared engraveable printing blank of claim 1 that is a printing plate, sleeve, or coated printing cylinder.

9. The flexographic infrared engraveable printing blank of claim 1 wherein the infrared absorbing material comprises carbon black, nigrosine, or iron oxide.

10. The flexographic infrared engraveable printing blank of claim 1 additionally comprising anti-ozone additives.

11. The flexographic infrared engraveable printing blank of claim 1 wherein the non-photosensitive flexographic liquid or paste precursor comprises the infrared absorbing material in an amount of 4% to 20% by weight of the total flexographic liquid or paste precursor.

12. The flexographic infrared engraveable printing blank of claim 1 wherein the non-photosensitive flexographic liquid or paste precursor comprises the heat decomposable peroxide in an amount of 1% to 12% by weight of the total flexographic liquid or paste precursor.

13. The flexographic infrared engraveable printing blank of claim 1 wherein the non-photosensitive flexographic liquid or paste precursor further comprises a filler that does not reduce the overall density of the flexographic blank after heat curing but remains inert within the system.

14. The flexographic infrared engraveable printing blank of claim 13 wherein the inert filler is fumed silica, bentonite, glass microspheres, or sodium pyrophosphate.

15. The flexographic infrared engraveable printing blank of claim 1 wherein the mixture of acrylate oligomers and acrylate or methacrylate monomers comprises at least one urethane oligomer.

16. The flexographic infrared engraveable printing blank of claim 15, wherein the at least one urethane oligomer comprises two acrylate groups per molecule.

17. The flexographic infrared engraveable printing blank of claim 1 wherein the mixture of acrylate oligomers and acrylate or methacrylate monomers comprises at least 80% urethane diacrylate oligomer.

18. The flexographic infrared engraveable printing blank of 1 wherein the amount of acrylate oligomers is between 15% and 40% by weight of the total mixture of acrylate monomers and acrylate or methacrylate monomers.

19. The flexographic infrared engraveable printing blank of claim 1 wherein at least 80% by weight of the mixture of acrylate oligomers and acrylate or methacrylate monomers is either mono-acrylate or mono-methacrylates and not di, tri, tetra, penta or more acrylate groups per molecule.

20. The flexographic infrared engraveable printing blank of claim 1 that is tear resistant.

21. The flexographic infrared engraveable printing blank of claim 1 wherein the mixture of acrylate oligomers and acrylate or methacrylate monomers includes isobornyl acrylate or methacrylate.

22. The flexographic infrared engraveable printing blank of claim 1 wherein the non-photosensitive flexographic liquid or paste precursor additionally comprises solvents in amounts below 5% by weight of the total flexographic liquid or paste precursor.

* * * * *

UNITED STATES PATENT AND TRADEMARK OFFICE

CERTIFICATE OF CORRECTION

PATENT NO. : 7,811,744 B2
APPLICATION NO. : 11/629886
DATED : October 12, 2010
INVENTOR(S) : Murray Figov It is certified that error appears in the above-identified patent and that said Letters Patent is hereby corrected as shown below:

| | |
|---|---|
| First Page<br>Col. 2<br>(Abstract) 6 | Delete "engravable" and insert -- engraveable --, therefor. |
| Claim 7<br>Col. 14,<br>line 41-42 (Approx.) | In Claim 7, lines 2-3, after "foam" delete "-like". |
| Claim 18<br>Col. 15,<br>line 15 | In Claim 18, line 1, after "of" insert -- claim --. |

Signed and Sealed this
Fourth Day of January, 2011

David J. Kappos

David J. Kappos
*Director of the United States Patent and Trademark Office*